United States Patent
Buehrer et al.

(10) Patent No.: US 6,884,734 B2
(45) Date of Patent: Apr. 26, 2005

(54) VAPOR PHASE ETCH TRIM STRUCTURE WITH TOP ETCH BLOCKING LAYER

(75) Inventors: Frederick W. Buehrer, Poughquag, NY (US); Derek Chen, Wappingers Falls, NY (US); William Chu, Hopewell Junction, NY (US); Scott Crowder, Ossining, NY (US); Sadanand V. Deshpande, Fishkill, NY (US); David V. Horak, Essex Junction, VT (US); Wesley C. Natzle, New Paltz, NY (US); Hung Y. Ng, New Milford, NJ (US); Len Y. Tsou, New City, NY (US); Chienfan Yu, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 680 days.

(21) Appl. No.: 09/989,822

(22) Filed: Nov. 20, 2001

(65) Prior Publication Data

US 2004/0198030 A1 Oct. 7, 2004

(51) Int. Cl.$^7$ .................. H01L 21/8234; H01L 21/302; H01L 21/461
(52) U.S. Cl. ................. 438/723; 438/739; 438/275
(58) Field of Search ................. 438/723, 739, 438/585, 595, 281, 275, 7, 197

(56) References Cited

U.S. PATENT DOCUMENTS

| | | | | |
|---|---|---|---|---|
| 5,972,755 A | * | 10/1999 | Hsu | 438/275 |
| 6,156,485 A | * | 12/2000 | Tang et al. | 438/723 |
| 6,420,097 B1 | * | 7/2002 | Pike et al. | 430/313 |
| 6,482,660 B2 | * | 11/2002 | Conchieri et al. | 437/7 |
| 6,528,363 B2 | * | 3/2003 | Ku et al. | 438/197 |
| 6,753,266 B1 | * | 6/2004 | Lukanc et al. | 438/739 |

* cited by examiner

*Primary Examiner*—John F. Niebling
*Assistant Examiner*—Walter L. Lindsay, Jr.
(74) *Attorney, Agent, or Firm*—William D. Sabo

(57) ABSTRACT

A blocking layer is formed on a hard mask having an initial thickness. Lines are fabricated by patterning the blocking layer and the hard mask to provide a line segment, the line segment having a first dimension measured across the line segment; reacting a surface layer of the line segment to form a layer of a reaction product on a remaining portion of the line segment; and removing the reaction product without attacking the remaining portion of the line segment and without attacking the blocking layer and the substrate to form the line segment with a second dimension across the line segment that is smaller than the first dimension. The blocking layer prevents the formation of reaction product on the hard mask so that the initial thickness of the hard mask is maintained. The blocking layer can also serve as an ARC layer for photoresist patterning so that the use of an additional film layer is not required.

38 Claims, 12 Drawing Sheets

Figure 5c
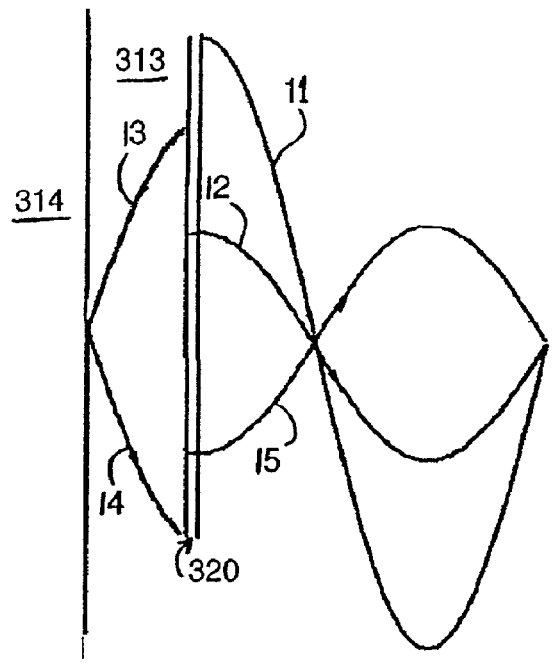
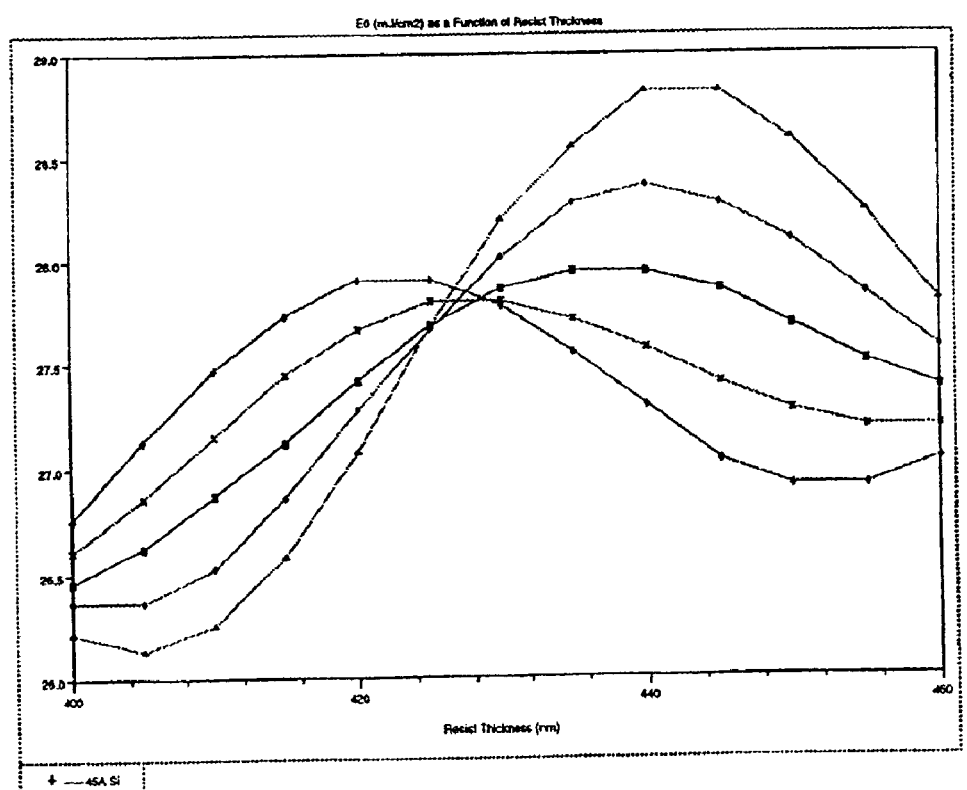
RESIST SWING CURVE
FIG. 5d (a)

(b)

(c)

VAPOR PHASE ETCH TRIM STRUCTURE WITH TOP ETCH BLOCKING LAYER

FIELD OF THE INVENTION

The present invention relates to semiconductor processing and particularly to building lines comprising the etching of hard masks to achieve greater sub-lithographic dimensions. More particularly, the present invention is especially advantageous for generating and controlling sub-lithographic gate in Field Effect Transistors (FETs).

BACKGROUND OF THE INVENTION

Microelectronic devices used in fabricating integrated circuits are manufactured by employing photolithographic techniques. Fabricating various structures, particularly electronic device structures, typically involves depositing at least one layer of a photosensitive material, generally known as a photoresist material on a substrate. The photoresist material may then be patterned by exposing it to radiation of a certain wavelength to alter characteristics of the photoresist material. In many instances, the radiation is from ultraviolet range of wavelengths causing desired photochemical reactions to occur within the photoresist. The photochemical reactions typically change the solubility characteristics of the photoresist, thereby permitting removal of certain selected portions of the photoresist while maintaining the other portions of the photoresist on the substrate. The selective removal of certain parts of the photoresist allows for protection of certain areas of the substrate while exposing other areas. The portions of the photoresist that remain on the substrate are used as a mask or stencil for processing the underlying substrate.

As methods for producing miniature electronic structures improve, the desire to produce even smaller structures has continued to increase. For instance, the reduction of the FET dimensions has been the primary vehicle pursued to meet the insatiable consumer need for faster electronics. A first-order correlation to faster FET is smaller gate width dimension, and therefore it is called the Critical Dimension (CD). FIG. 1 shows a simple cross-sectional schematic of an FET. Thin dielectric 5 is between substrate 1 and gate electrode 4. Source 2 and drain 3 are doped regions to the sides of gate electrode 4. The width of the gate is CD 6. It is generally known to those skilled in the art that as the CD gets smaller, the FET gets faster.

The dimension of most key features in microelectronics is limited by the dimension of the resist that is printed in a photolithography step. Therefore, the primary focus for producing smaller CDs has been upon improved photolithography. FIGS. 2a–2d shows a most common manufacturing process used to create a FET. A stack of films is deposited on wafer or substrate 110 as illustrated in FIG. 2a. First, thin dielectric 112, usually a thermal oxide (Tox), is grown on substrate 110. Then gate material 114 is deposited, which is usually polysilicon. Then photoresist 116 is spun on. FIG. 2b shows the lithography process. Photoresist 116 is exposed to light energy through a mask, and when washed with a developer, desired pattern 122 remains. This pattern exposes the layer underneath to the gate electrode etch process as shown in FIG. 2c. Usually, this etch process is a RIE (Reactive Ion Etch) which removes the exposed layer, yet keeps the features under the photoresist mask. Finally, the photoresist is removed and only desired gate electrode 114 remains. The width of photoresist 122 was transferred directly to gate electrode 114, minus etch-bias 118 from the RIE. Etch-bias 118 is the difference between initial photoresist CD 122 and final gate electrode CD 142 as shown in FIG. 2d.

Different etching processes and compositions can produce more or less etch-bias. A larger etch-bias produces smaller gate CDs. However, there is typically a cost associated with this desired result. Some compositions will produce large N-I (nested to isolated linewidth) offset deltas when the etch-bias is too high. Other compositions will produce undesirable sidewall profiles. A major problem of the RIE aggressively going after a large etch-bias is the complete removal of the photoresist mask during the etch. This results in "opens" or removal of the polysilicon gate feature completely in a localized or general area.

Another method for defining gate electrodes is with a hard mask process. FIGS. 3a–3d show that this method simply inserts material 313 which is usually a dielectric, between photoresist 116 and gate material 114. This requires an extra etch step to etch material 313 using photoresist 116 as the soft mask. Hard mask gate definition is often used to enhance polysilicon gate profile and decrease aspect ratio so that removing bottom corner of gate material 114 is easier. However, the same problems described above for the soft mask (photoresist) method exist for the hard mask method when etch-bias is aggressively pursued in order to achieve sub-lithographic features.

One particular current technique for achieving sub-lithographic gate CD involves a separate photoresist trimming step. Here, the "as printed" photoresist is consumed by an oxygen plasma prior to RIE etching. However, there is a limit to how much the resist can be trimmed and the resist retain acceptable profiles. Projected manufacturing demands for smaller linewidths cannot be met by current photo and RIE trim capabilities.

One key process which has been developed is a trim process using a vapor phase etch (VPE) process as described in commonly assigned pending application, Ser. No. 09/727,139, "Etching of Hard Masks" by Cantell et al., filed on Nov. 30, 2000, herein incorporated by reference. The VPE process described by Cantell et al. is a self-limiting etch and has very little to no N-I linewidth offset deltas which produces uniformities less than about 1%, 1 sigma. In addition, the VPE process is insensitive to pattern loading; that is, the same amount of etch removal is done on each line independent of the number of lines per unit area (pattern loading). Whether within a chip or within a wafer, the same amount of etch removal occurs on all lines that are exposed to the VPE process independent of pattern loading. However, the VPE process described by Cantell et al. does not address preserving the initial thickness of the hard mask that is deposited. With the resist removed, the thickness of the hard mask is thinned down by the VPE process thereby requiring a thicker initial thickness for the hard mask. A thicker hard mask would require a longer etch time during the hard mask definition step where photoresist is used as the soft mask, thus increasing erosion of the photoresist and adversely affecting the profile of the hard mask. In many instances, limitations on photoresist thickness prohibit increasing the photoresist thickness to compensate for the longer hard mask etch time.

Not only is it desired to achieve small CDs, it is important to minimize the non-uniformity in CDs across a wafer or across a chip. Differences in topography can contribute to differences in resist thickness which in turn contribute to non-uniformities in the resist linewidth. Generally, the top and bottom surfaces of the resist layer are in contact with materials which have a different index of refraction than the resist. These index of refraction differences give rise to light reflections at each interface. At certain resist thicknesses there can be constructive or destructive interference between the various reflected light waves giving rise to a light intensity within the resist which depends on resist thickness. These differences in light intensity result in differences in CD of the developed resist line.

Generally, the reflections are minimized by placing an anti-reflective coating (ARC) between the resist and the underlying substrate. Most organic and some inorganic ARCs operate by absorbing incident light. Essentially all inorganic ARCs require careful control of the composition of the inorganic layer. The type which absorbs incident light must match the index of refraction of the ARC at the resist interface to the index of refraction of the resist to minimize reflections at the interface. In another type, the index of refraction, light absorbency, and thickness are all controlled to minimize reflection. If the underlying material or resist index of refraction changes, then the composition and thickness of this type of ARC must be changed and redeveloped.

As the demand for smaller and more uniform CDs continues, there is a need for new methodologies to produce such smaller and more uniform CDs. Achieving smaller photoresist CDs has proved very difficult as the current technology is at the end of the UV spectrum. Other methods for producing sub-lithographic features are desired. Bearing in mind these demands and deficiencies of the prior art, it would therefore be desirable to provide an improved method of forming a semiconductor device.

SUMMARY OF THE INVENTION

The present invention makes possible a method for producing sub-lithographic gate electrode widths. The method of the present invention can be carried out with little or no detriment to N-I offset or opens, as is typical of other methods. In addition, the method of the present invention is insensitive to pattern loading.

More particularly, the present invention relates to a method of fabricating a line comprising the steps of:

providing a substrate having a hard mask material with a first thickness on the substrate;

forming a blocking layer on the hard mask material;

patterning the blocking layer and the hard mask material to provide a line segment, the line segment having a first dimension measured across the line segment;

reacting a surface layer of the line segment to form a layer of a reaction product on a remaining portion of the line segment not covered by the blocking layer; and removing the reaction product without attacking the remaining portion of the line segment and without attacking the blocking layer and the substrate to form the line segment with a second dimension across the line segment that is smaller than the first dimension, and wherein the thickness of the hard mask material remains equal to the first thickness.

Further, the invention relates to utilizing the blocking layer on the hard mask material as an ARC layer so that an additional film for photoresist patterning is not required.

BRIEF DESCRIPTION OF THE DRAWINGS

The features of the invention believed to be novel and the elements characteristic of the invention are set forth particularly in the appended claims. The figures are for illustrative purposes only and are not drawn to scale. The invention itself, however, both as to organization and method of operation, may be understood by reference to the detailed description which follows taken in conjunction with the accompanying drawings in which:

FIGS. 5a–d illustrates the use of the blocking layer as an anti-reflective coating (ARC).

DETAILED DESCRIPTION OF THE INVENTION

Figure 1:
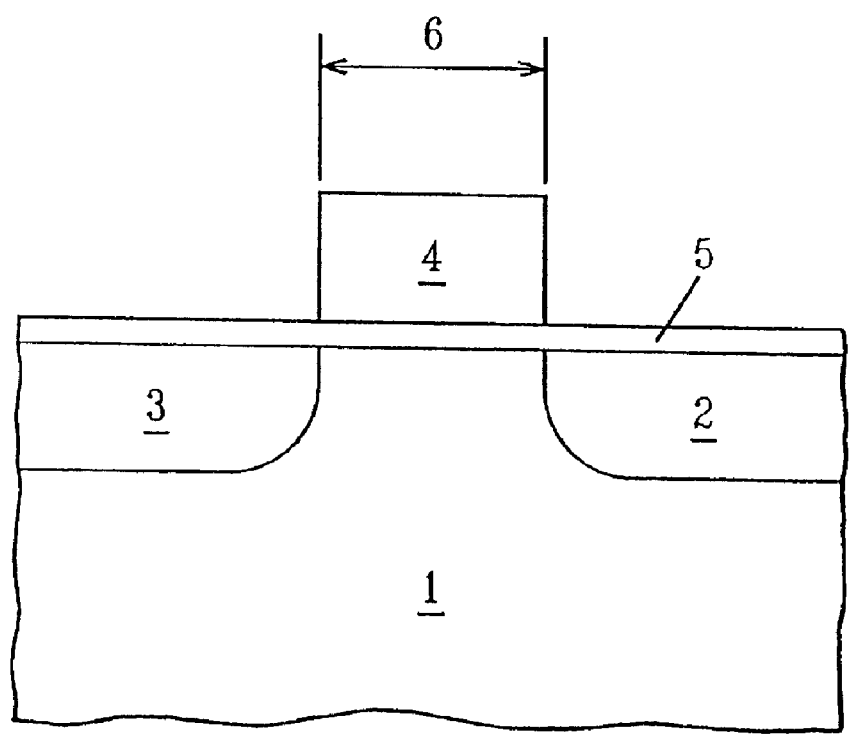
FIG. 1 is an illustrative schematic of a simple FET cross-sectional view as disclosed in the prior art.
Figure 2A:
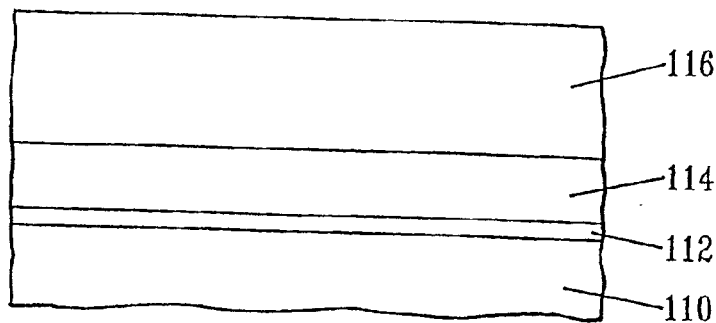
FIGS. 2a–2d represent a process flow illustrating typical prior art for soft-mask gate electrode definition.
Figure 2B:
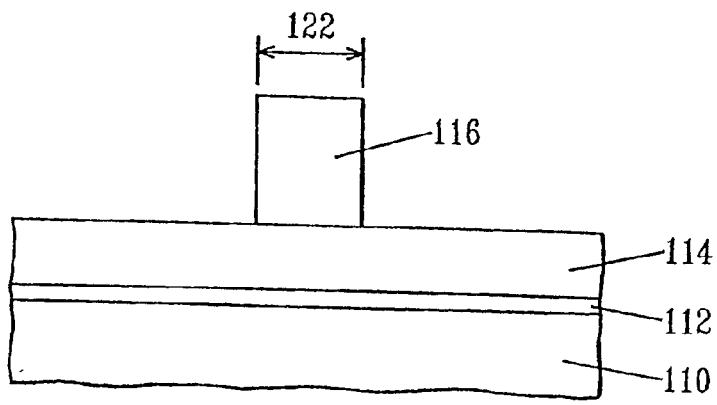
Figure 2C:
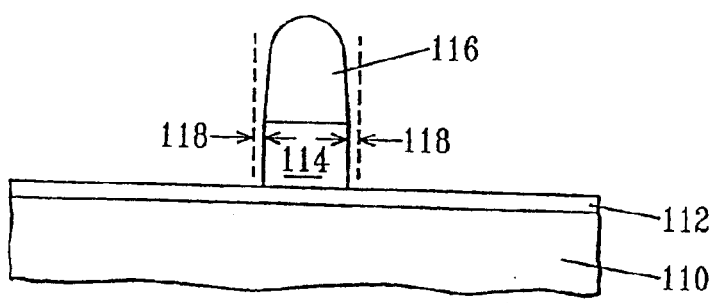
Figure 2D:
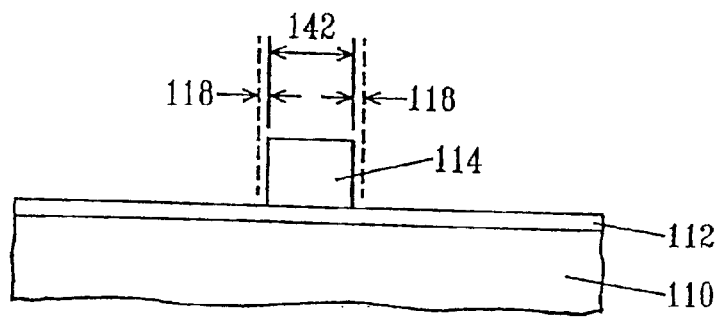
Figure 3A:
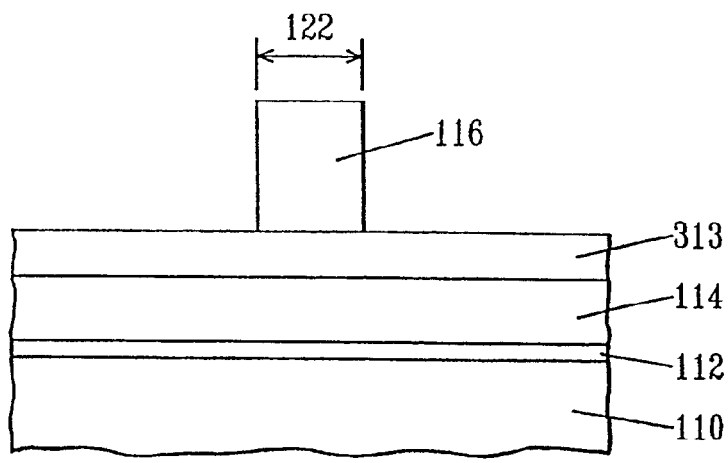
FIGS. 3a–3d represent a process flow illustrating typical prior art for hard-mask gate electrode definition.
Figure 3B:
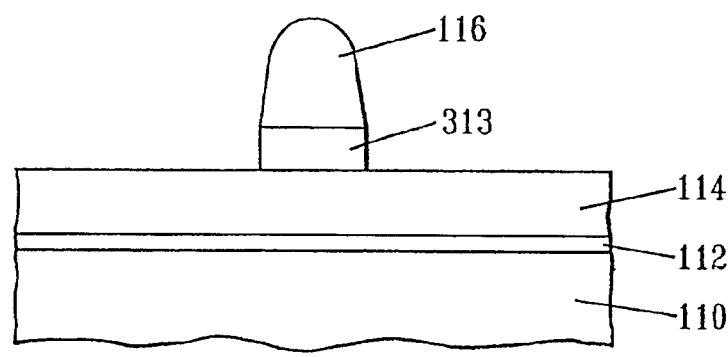
Figure 3C:
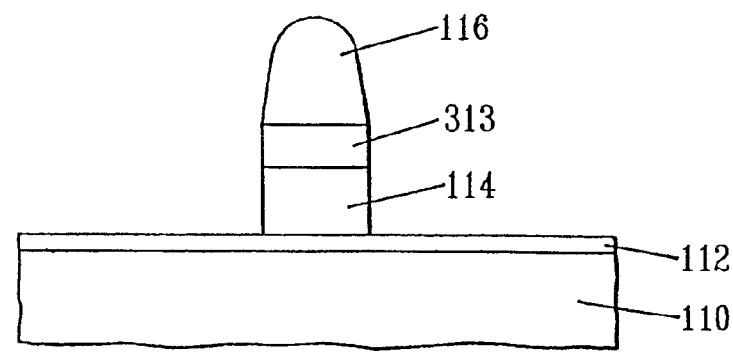
Figure 3D:
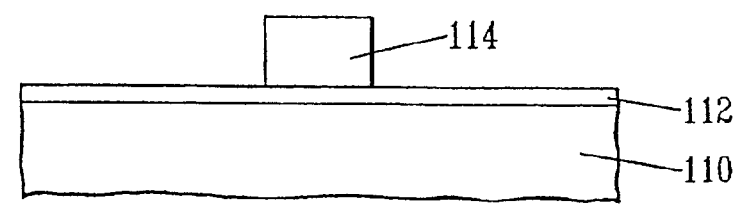

In order to facilitate an understanding of the present invention, reference will be made to the figures in which like numerals refer to like features of the invention. Features of the invention are not necessarily drawn to scale in the drawings.

The present invention overcomes the prior art by providing a new method for obtaining reduced CD widths using present photolithography and RIE etch with little or no detriment to N-I offset, and independent of pattern loading.

First Embodiment

Figure 4A:
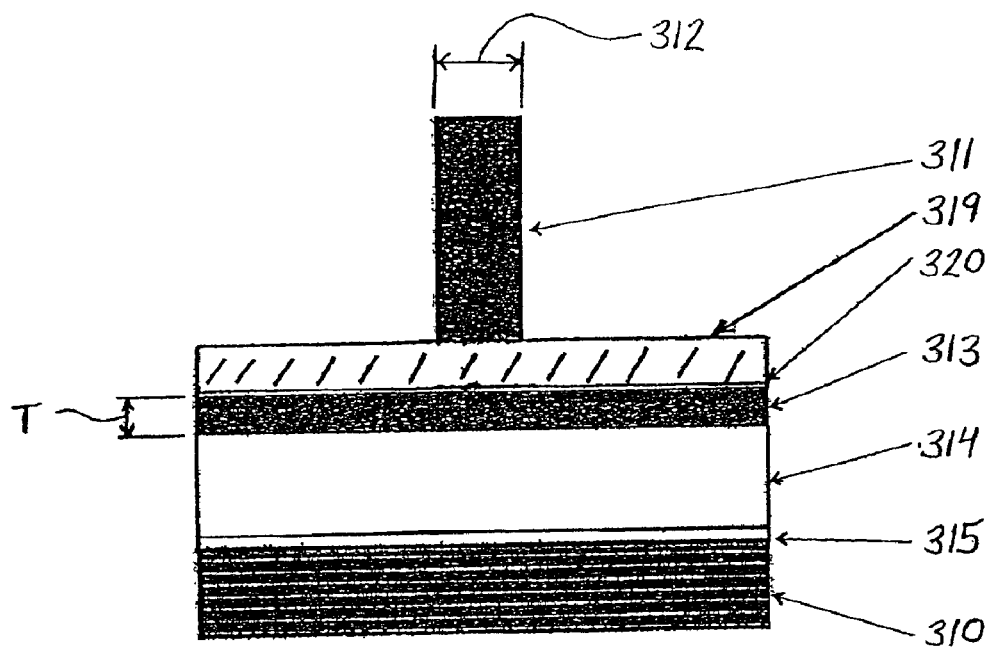
FIGS. 4a–4g represent a process flow illustrating a preferred embodiment of this invention.

The present invention provides an improved method for achieving sub-lithographic gate electrode widths, and is illustrated in FIGS. 4a–4f. As shown in FIG. 4a, a stack of films is formed on wafer or substrate 310. First, thin dielectric 315, preferably a thermal oxide (Tox), is grown on substrate 310. Then, gate material 314 is formed, preferably polysilicon deposited by methods known in the art such as LPCVD. Hard mask 313, preferably an oxide or silicon oxynitride deposited by CVD having thickness T, is then formed on gate material 314. Blocking layer 320 is then formed on hard mask 313. Blocking layer 320 can be any material that, when exposed to a vapor phase etch, will have a very low etch rate compared to hard mask 313. For hard mask 313 consisting of oxide or silicon oxynitride, silicon or germanium are preferred materials that can be used to form blocking layer 320. Other materials can be used to form blocking layer 320 such as, for example, metals such as aluminum or copper, and organic materials such as anti-reflective coating AR3. For the first embodiment of the present invention, blocking layer 320 is formed by sputter deposition of about 35 to about 50 Angstroms of silicon onto hard mask 313. Anti-reflective coating (ARC) layer 319 is formed by methods known in the art such as coating AR3 onto blocking layer 320. Photoresist pattern 311 with CD 312 is formed on ARC layer 319 by photolithographic methods known in the art.

Figure 4B:
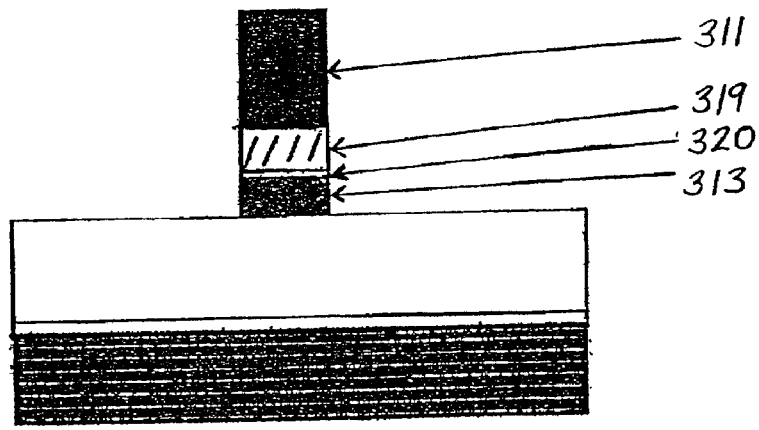
Figure 4C:
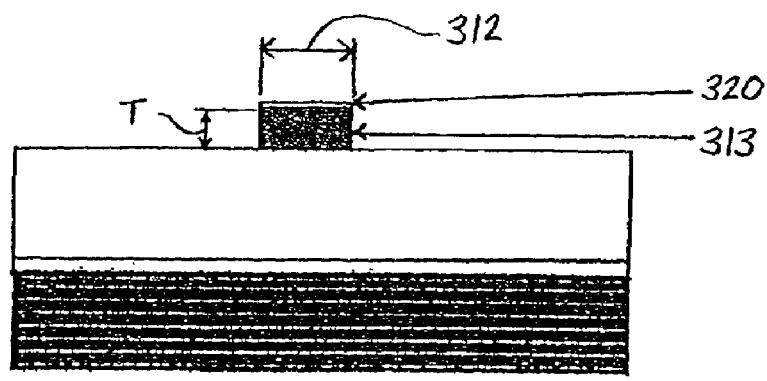

Exposed portions of blocking layer 320 and hard mask 313 are then etched using an RIE process as shown in FIG. 4b. FIG. 4c shows that after photoresist pattern 311 and ARC layer 319 are removed, only desired blocking layer 320 and hard mask 313 remain. CD 312 of photoresist 311 was transferred directly to blocking layer 320 and hard mask 313. In addition, the initial thickness T of hard mask 313 is maintained.

Figure 4D:
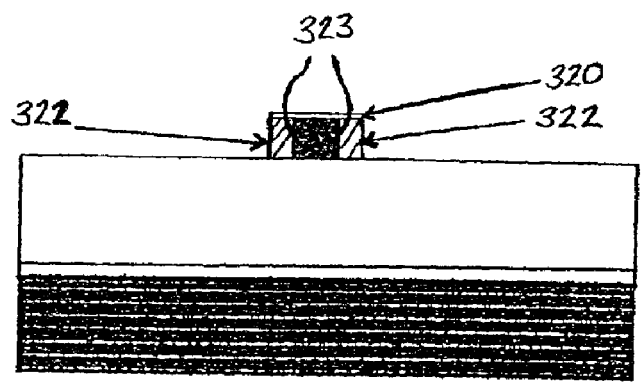
Figure 4E:
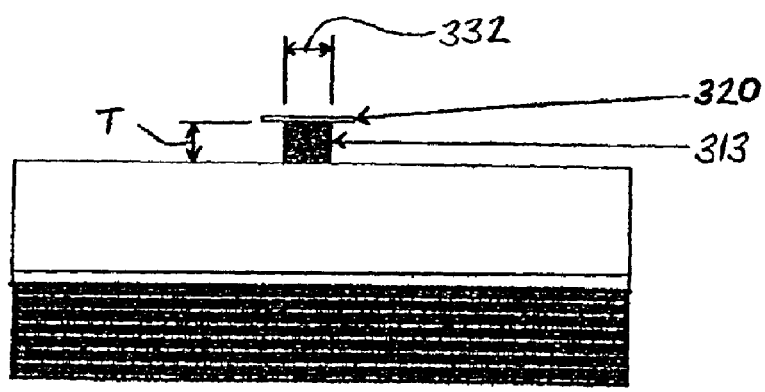

FIG. 4d shows reacting a surface layer of an etch line segment of hard mask 313 to form a layer of reaction product 322 on exposed surfaces 323 of the line segment. Where blocking layer 320 is present, reaction product 322 is prevented from forming. Reaction product 322 is removed without attacking the remaining portion of hard mask 313 and without attacking blocking layer 320 and gate material 314, to form the line segment with CD 332 across the line segment as shown in FIG. 4e that is smaller than initial dimension CD 312 of etched hard mask 313. This step provides additional etch-bias, i.e. it further shrinks the CD below what photolithography can print; however, it does so with little or no increase in N-I offset, or affect on polysilicon profile as is typical of increasing etch-bias or adding photoresist or ARC trim steps with current RIE processes. In addition, the VPE process is insensitive to pattern loading. Compared to current VPE processes, blocking layer 320 prevents erosion of the thickness of hard mask 313 so that initial deposited thickness T of hard mask 313 is maintained as well as the profile of hard mask 313.

The preferred method to carry out the reaction step shown in FIG. 4d is by VPE. VPE is an isotropic, self-limiting etch. That is, it etches in all directions (isotropic) and the etching mechanism slows to an extremely low etch rate (essentially stops) after a certain amount of material has been etched (self-limiting). These two features are utilized according to the present invention to shrink the CD of the hard-mask uniformly and repeatably independent of pattern loading, and with little to no N-I (nested to isolated linewidth) offset.

The preferred VPE employed in the present invention includes HF and $NH_3$ in a preferred ratio of about 2:1. The process can be carried out in a standard single wafer etch chamber. The chamber pressure employed is typically from about 0.5 mTorr to about 50 mTorr, more typically from about 5 mTorr to about 10 mTorr. The pressure is sufficiently low that pattern loading effects within a chip are non-existent. Higher pressure processes, or plasma/RE processes can show loading effects from localized depletion of reactants from substrate charging differences, or from electron emission differences. The present invention does not show these effects because it does not use a plasma and it operates at a low pressure.

The temperature of the wafer during the VPE is typically about 10° C. to about 35° C., a particular example being normal room temperature. The temperature of the wafer can be used to tailor the amount of reaction product formed on the wafer. The higher the temperature with respect to ambient (the chamber walls), the lower the amount of reaction product that forms on the wafer.

The gasses are not mixed in a manifold, but are introduced into the chamber separately. The top endpoint port of the chamber is used as an entrance for the HF. The VPE process is a two step process. During the first step (reaction step) of the VPE process, solid reaction product 322 (ammonium hexaflourosilicate) shown in FIG. 4d is formed on exposed surfaces 323 of hard mask 313. On surfaces where blocking layer 320 is present, reaction product 322 is prevented from forming thus preserving initial thickness T of hard mask 313. In the second step of the VPE, the desorb step, solid reaction product 322 is removed.

FIGS. 4a–4g show a flow diagram of a preferred embodiment process flow. Silicon blocking layer 320 on silicon dioxide (or other hard mask material) 313 which is on polysilicon layer 314 located on gate oxide layer 315 which in turn is located on substrate 310 is defined. The wafer then enters the VPE process. First, the wafer is put into the VPE reaction chamber and the HF and $NH_3$ react with exposed surfaces 323 of hard mask 313. The reaction consumes exposed surfaces 323 of hard mask 313 isotropically and creates solid ammonium hexaflourosilicate reaction product 322 (see FIG. 4d) on exposed surfaces 323. As this reaction product gets thicker, the reaction rate decreases and eventually slows to an extremely low rate (essentially stops) when the reaction product thickness is from about 50 Angstroms to about 400 Angstroms. This causes the self-limiting property of the VPE process, which allows all lines to achieve substantially the same amount of oxide removal. It also produces a very uniform and repeatable etch. The self-limiting reaction means variations in the amount of hard mask trimming should be minimized within a wafer, from wafer to wafer, from tool to tool and from one product part to another.

The wafer is then removed from this chamber and sent to the desorb step that can be done in either an RTP (Rapid Thermal Process) chamber by heating the wafer preferably to about 100° C. or above, more preferably to about 100° C. to about 200° C., or exposing the wafer to a water bath to be rinsed. This removes solid reaction product 322 resulting in hard mask features 313 that are narrower as shown in FIG. 4e. Blocking layer 320 remains on the narrow hard mask features. Typically, additional etch biases from the VPE process are preferably on the order of about 10 to about 40 nanometers (i.e. about 5 to about 20 nanometers of horizontal etching on each side of the hard-mask), more preferably on the order of about 20 to about 30 nanometers. The normal width of the hard mask prior to the etch bias is about 80 to about 200 nanometers, more typically about 100 to about 150 nanometers. Thickness T of hard mask 313 is preferably from about 300 to about 2000 Angstroms, more preferably from about 500 to about 1000 Angstroms. Blocking layer 320 prevents erosion of the thickness of hard mask 313 so that initial thickness T is maintained as well as the profile.

Figure 4F:
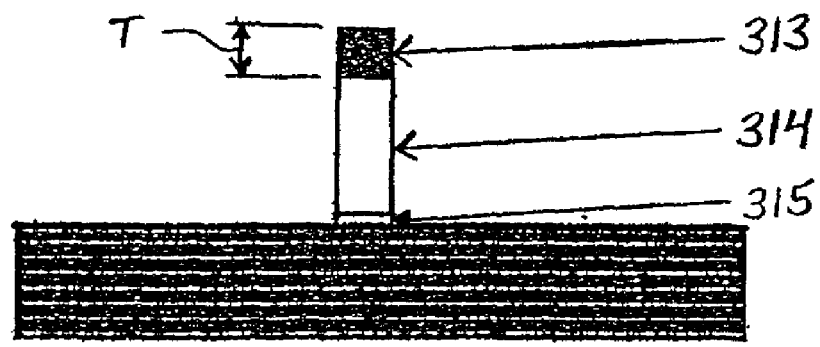
Figure 4G:
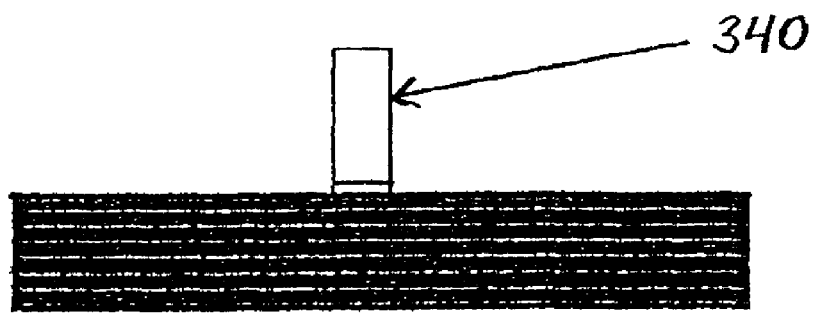

Narrower hard mask 313 with original thickness T is then used as a mask to define gate material 314 as illustrated in FIG. 4f. Exposed polysilicon gate material 314 is etched using an RIE process which also etches silicon blocking layer 320. Oxide hard mask 313 is then removed resulting in gate electrode 340 shown in FIG. 4g.

Figure 5A:
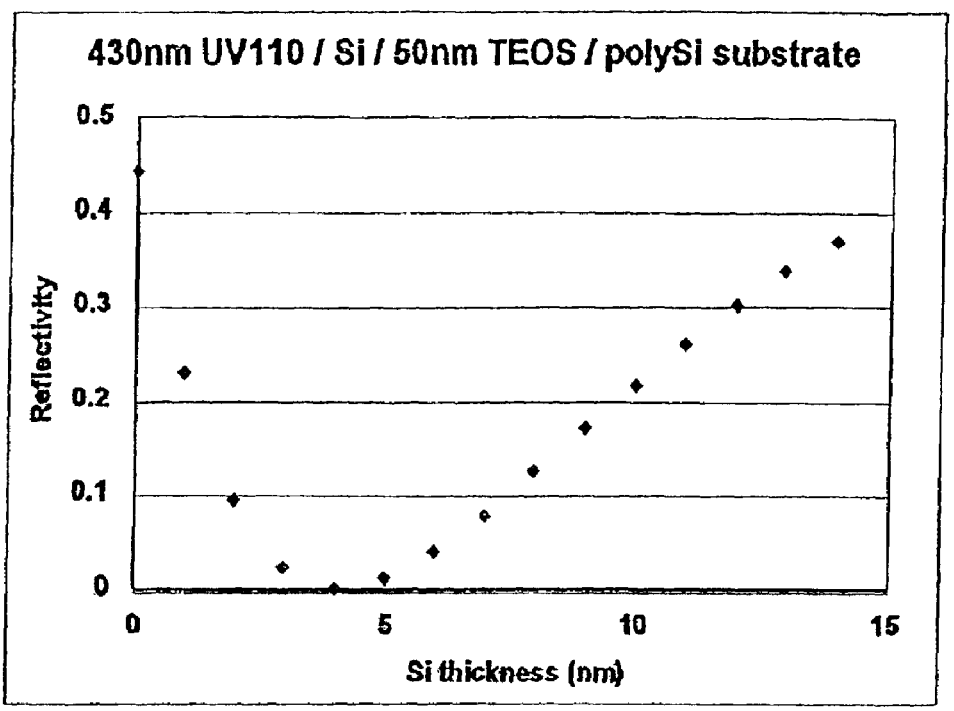
Figure 5B:
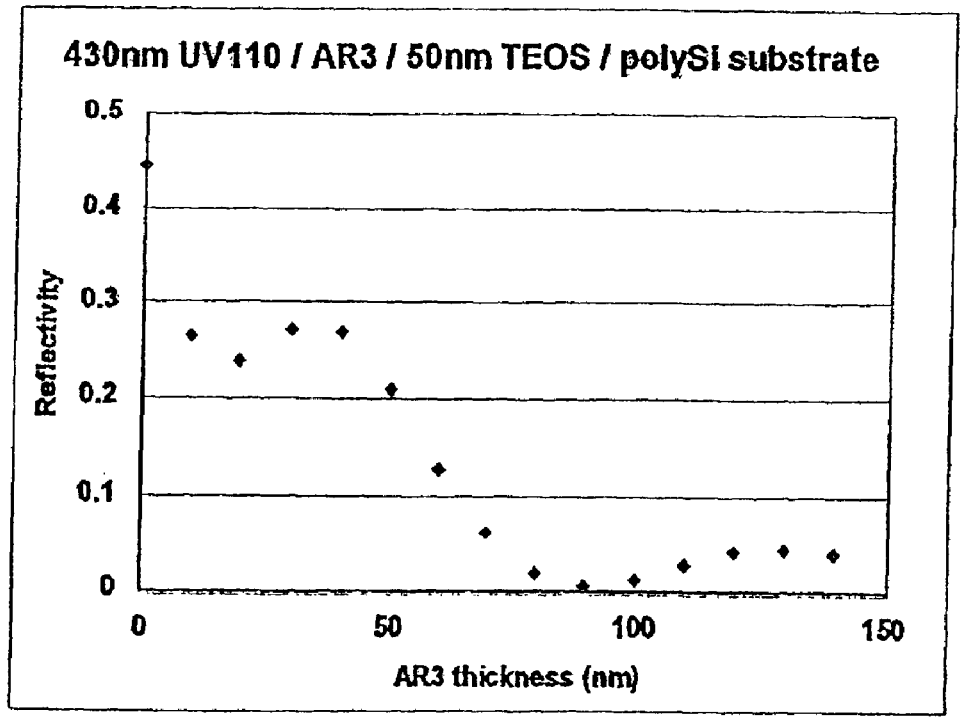

Blocking layer 320 can also serve an additional function as an ARC layer. The thickness of blocking layer 320 is chosen in conjunction with the thickness of the underlying films so that blocking layer 320 provides the function of an ARC layer. With hard mask 313 of oxide and blocking layer 320 of silicon, thickness T of oxide hard mask 313 is preferably from about 400 to about 600 Angstroms and silicon blocking layer 320 is preferably from about 40 to about 45 Angstroms. For example, a preferred thickness T of oxide hard mask 313 is about 500 Angstroms and a corresponding preferred thickness of silicon blocking layer 320 is about 42.5 Angstroms to maximize the reflectivity benefit as is shown in the reflectivity curve of FIG. 5a. FIG. 5b shows the reflectivity curve for a conventional ARC such as AR3.

FIG. 5c represents an instantaneous snapshot of the field intensity of light incident on the stack of films when a node in field intensity is located at gate material 314. Light wave 11 is incident upon blocking layer 320. A portion of the light energy is reflected off the surface of blocking layer 320 to produce light wave 12. After passing through blocking layer 320, the field intensity of the light is reduced because blocking layer 320 absorbs a portion of the light energy to yield a field intensity shown as light wave 13 within hard mask 313. Light wave 13 passes through hard mask 313 with low attenuation. Light wave 13 reflects off gate material 314, experiences a further attenuation upon reflection (not shown), and travels back through hard mask 313 as light wave 14. The field strength is further reduced as light wave 14 passes through blocking layer 320. The intensity of transmitted light wave 15 matches the intensity of reflected light wave 12. The phase difference of light waves 12 and 15 is 180 degrees, so the two light waves destructively interfere and the net reflectivity of blocking layer 320 is zero. The phase difference is 180 degrees because the thicknesses of hard mask 313 and blocking layer 320 were chosen so that the optical path length of light traveling through blocking layer 320, reflecting off gate material 314 and passing back through blocking layer 320 is about one-half wavelength. Thickness T of blocking layer 320 is chosen so that the intensity of light wave 12, which reflects from the surface of blocking layer 320, has an intensity equal to light wave 15, which is transmitted with attenuation through blocking layer 320, transmitted through hard mask 313, reflected from the surface of gate material 314, and again transmitted through hard mask 313 and blocking layer 320. Those skilled in the art will recognize that the above description is qualitative. Modeling with a program such as Prolith will enable tuning the thicknesses for other substrates.

FIG. 5d shows a Prolith model of the energy absorbed in photoresist pattern 311 as a function of resist thickness for a series of different thicknesses of blocking layer 320. For photoresist pattern 311 having a thickness of about 445 nm, when blocking layer 320 has thickness T that is too thin, the reflectivity is dominated by the reflectivity of gate material 314 and there is constructive interference within photoresist pattern 311 leading to a high level of reflected energy as shown in the uppermost curve for a thickness T of 35 Angstroms for blocking layer 320. When thickness T of blocking layer 320 is too thick, the reflectivity is dominated by the reflectivity from the surface of blocking layer 320, and the effective optical thickness of photoresist pattern 311 and blocking layer 320 is reduced by about one-quarter wavelength leading to destructive interference, and the thickness of photoresist pattern 311 with constructive interference is shifted by a quarter wavelength in thickness. At the correct thickness T of blocking layer 320, there is a minimum change in absorbed energy with changes in the thickness of photoresist pattern 311.

To summarize the use of blocking layer 320 as an ARC layer, a mostly transparent hard mask 313 such as silicon dioxide is deposited on gate material 314, in this case polysilicon. Blocking layer 320 is formed by sputtering (or other means) of silicon on hard mask 313. It is understood that silicon blocking layer 320 forms a native oxide upon exposure to atmosphere. Photoresist pattern 311, is formed on top of blocking layer 320. Adhesion of photoresist pattern 311 to blocking layer 320 is improved by exposure of blocking layer 320 to an adhesion promoter such as hexamethyldisilizane (HMDS) prior to formation of photoresist pattern 311.

Second Embodiment

According to a second embodiment of the present invention, the blocking layer can be any material that can be removed selective to both hard mask 313 and gate material 314, in addition to blocking the VPE process. Thus, it is desired to remove the blocking layer immediately prior to the RIE of gate material 314 so that the blocking layer is not present during the RIE.

Figure 6:
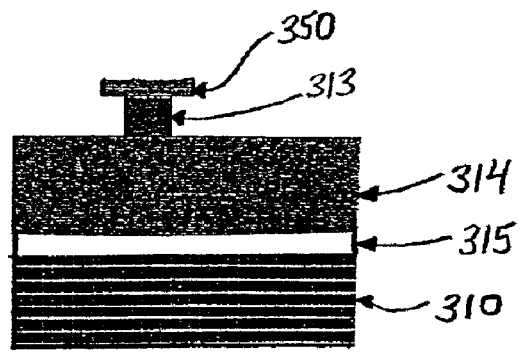
FIGS. 6a–c illustrate a second preferred embodiment of the present invention.
Figure 6:
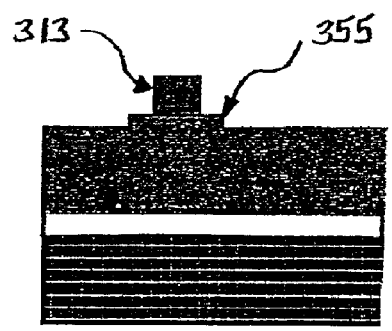
Figure 6:
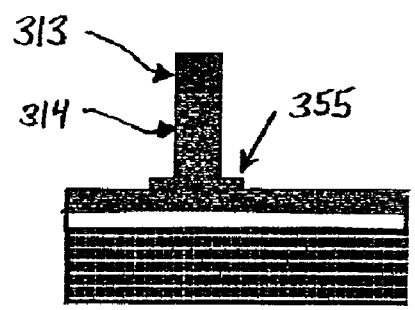

In the first embodiment, blocking layer 320 is present during the RIE of gate material 314 as it is relied upon that the RIE will also remove blocking layer 320 as gate material 314 is being etched. Thus, as the thickness of the blocking layer increases to obtain a desired ARC reflectivity or to further enhance robustness of the layer, a problem can occur as a thick blocking layer can perturb the RIE etch front. Such a problem is illustrated, for example, in FIG. 6a, where thick blocking layer 350 is used to block the VPE process so that initial thickness T of hard mask 313 is maintained. Hard mask 313 has been trimmed by the VPE process as described in the first embodiment. As the RIE process begins on gate material 314 in FIG. 6b, however, thick blocking layer 350 "shadows" the RIE process and notch 355 begins to form. FIG. 6c shows notch 355 which would be formed on gate material 314 at the completion of the RIE process.

In order to overcome such a problem, a suitable material, such as germanium, can be used to form thick blocking layer 350. Using oxide hard mask 313 and polysilicon gate material 314, thick blocking layer 350 is formed using germanium to block the VPE process to preserve initial thickness T of oxide hard mask 313, and is removed selective to oxide hard mask 313, and, in addition, is removed selective to polysilicon gate material 314. Germanium has the property of being soluble in hydrogen peroxide ($H_2O_2$). Hydrogen peroxide oxidizes germanium to form germanium oxide ($GeO_2$) which is in turn water soluble. After removing the solid reaction product of the VPE process (as described in the first embodiment), substrate 310 is immersed in hydrogen peroxide. Germanium blocking layer 350 becomes water soluble and is removed selective to hard mask 313 and polysilicon gate material 314. Thus, during the RIE of polysilicon gate material 314, there is no blocking layer present, thereby avoiding shadowing of the RIE process and forming a notch in gate material 314. The resulting gate material 314 formed by the second embodiment is the same as that shown in FIG. 4g.

Third Embodiment

Figure 7A:
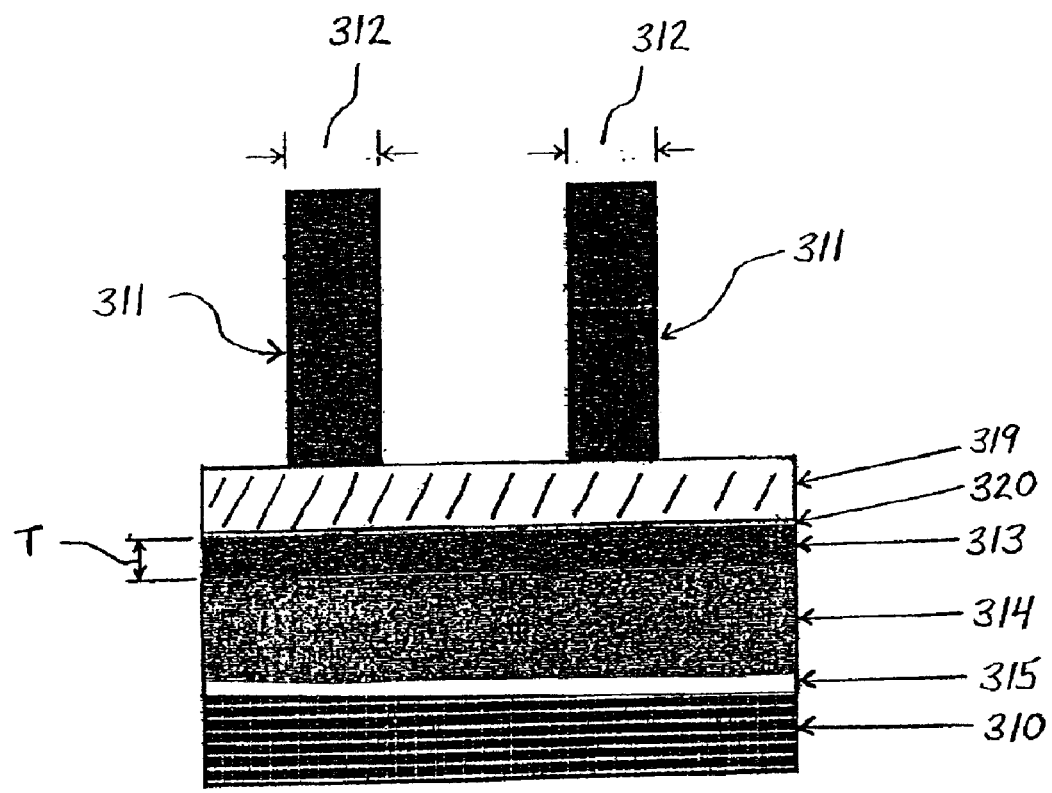
FIGS. 7a–f illustrate a third preferred embodiment of the present invention.
Figure 7B:
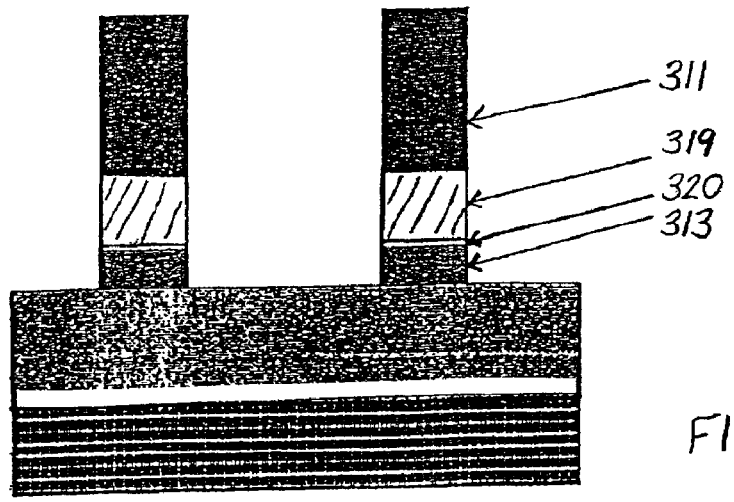
Figure 7C:
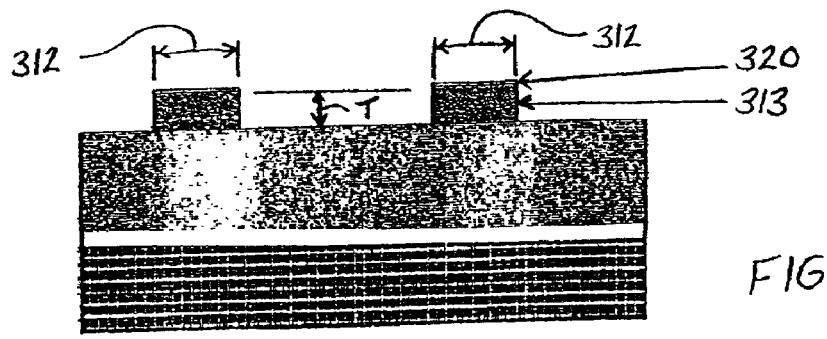
Figure 7D:
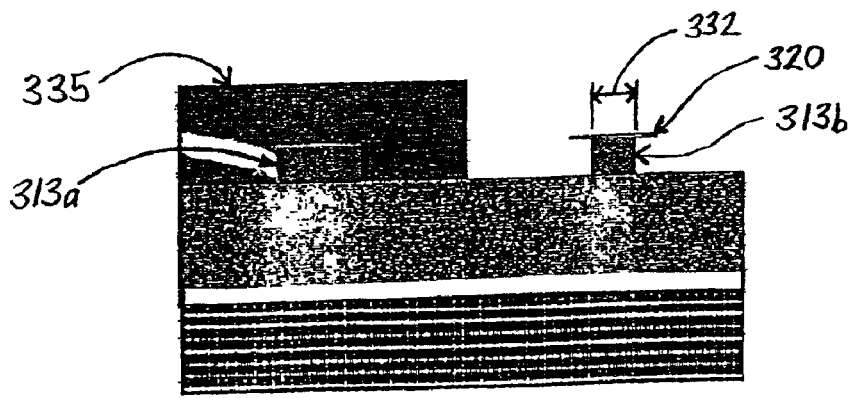

In a third embodiment of the present invention, a block resist mask is used in combination with the blocking layer/VPE process described in accordance with the first and second embodiments to obtain two different CDs, at least one or both of which are smaller than the photolithographic capability. FIG. 7a shows the same stack of films formed on substrate 310 as is shown in FIG. 4a. Photoresist pattern 311 with CD 312 is formed on ARC layer 319 which is on blocking layer 320. Blocking layer 320 is formed on hard mask 313 having a thickness T. Exposed portions of blocking layer 320 and hard mask 313 are then etched using an RIE process as shown in FIG. 7b. If additional trimming is required, an RIE trim of the photoresist 311 can be done prior to the etching of blocking layer 320 and hard mask 313. FIG. 7c shows that after ARC layer 319 and photoresist pattern 311 are removed, only desired blocking layer 320 and hard mask 313 remain. CD 312 of photoresist 311 was transferred directly to blocking layer 320 and hard mask 313. FIG. 7d shows blocking resist 335 formed by photolithographic methods known in the art on hard mask 313a. Hard mask 313b is then trimmed using the VPE process as described in FIG. 4d resulting in CD 332 which is smaller than CD 312 of hard mask 313a. Blocking resist 335 prevents hard mask 313a from being trimmed by the VPE process. In addition, blocking layer 320 prevents erosion of thickness T of hard mask 313b so that the thickness of hard mask 313a and the thickness of hard mask 313b remain equal to initial thickness T of hard mask 313. Blocking layer 320 also maintains the profile of hard mask 313b so that it is substantially the same as the profile of hard mask 313a.

Figure 7E:
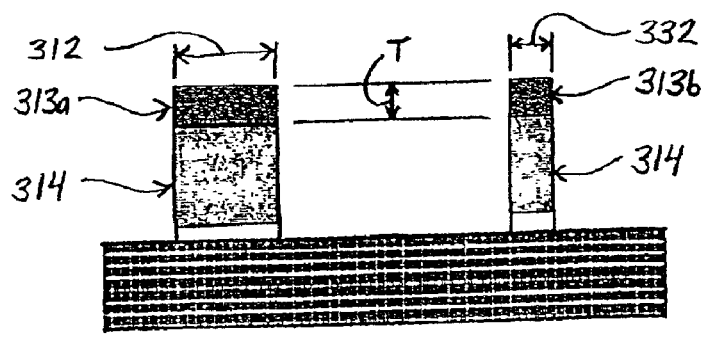
Figure 7F:
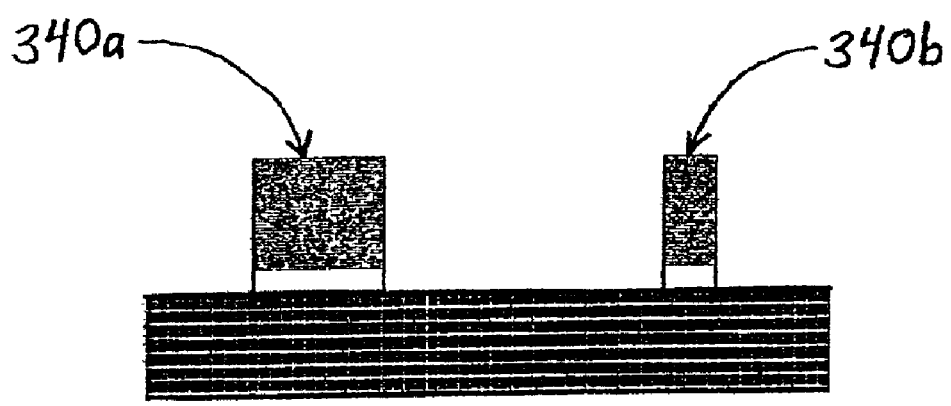

Blocking resist 335 is then removed as shown in FIG. 7e. If additional trim is required, the VPE process can be performed again to further reduce CD 312 and CD 332. At this point, blocking layer 320 can remain on hard mask 313 as described in the first embodiment, or it can be removed as described in the second embodiment. Gate material 314 is then etched using an RIE process. FIG. 7f shows resulting gate electrodes 340a and 340b formed by the method of the third embodiment.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of fabricating a line comprising:
   providing a substrate having a hard mask material with a first thickness on the substrate;
   forming a blocking layer on the hard mask material;
   patterning the blocking layer and the hard mask material to provide a line segment, the line segment having a first dimension measured across the line segment;
   reacting a surface layer of the line segment to form a layer of a reaction product on a remaining portion of the line segment not covered by the blocking layer; and
   removing the reaction product without attacking the remaining portion of the line segment and without attacking the blocking layer and the substrate to form the line segment with a second dimension across the line segment that is smaller than the first dimension, and wherein the thickness of the hard mask material remains equal to the first thickness.

2. The method of claim 1, wherein the step of reacting a surface layer of the line segment comprises a self-limiting reaction.

3. The method of claim 1, wherein the first dimension is a minimum dimension achievable with a photolithographic process.

4. The method of claim 1, wherein after the step of removing the reaction product, the second dimension of the line segment is a sub-lithographic dimension.

5. The method of claim 1, wherein after the step of removing the reaction product the line segment is used to form a gate electrode of an FET.

6. The method of claim 1, wherein the hard mask comprises silicon dioxide or silicon oxynitride.

7. The method of claim 1, wherein the step of reacting a surface layer of the line segment comprises HF and $NH_3$.

8. The method of claim 7, wherein the step of removing the reaction product comprises heating or dissolving the reaction product in a solvent comprising water.

9. The method of claim 1, wherein the blocking layer comprises silicon.

10. The method of claim 1, wherein the blocking layer comprises germanium.

11. The method of claim 10, wherein after the step of removing the reaction product the blocking layer is removed without attacking the line segment and the substrate.

12. The method of claim 11, wherein the blocking layer is removed by a solution comprising hydrogen peroxide.

13. The method of claim 1, wherein the blocking layer is formed by sputter deposition.

14. The method of claim 1, wherein the blocking layer has a thickness from about 35 Angstroms to about 50 Angstroms.

15. The method of claim 1, wherein the step of patterning comprises providing a plurality of lines of approximate line widths.

16. The method of claim 1, wherein after the step of removing the reaction product, the second dimension is about 10 nanometers to about 40 nanometers smaller than the first dimension.

17. The method of claim 16, wherein the second dimension is about 20 nanometers to about 30 nanometers smaller than the first dimension.

18. The method of claim 1, wherein the step of removing the reaction product comprises heating to a temperature of about 100° C. or above.

19. The method of claim 1, wherein the step of reacting a surface layer of the line segment comprises HF and $NH_3$ at a ratio of about 2:1.

20. The method of claim 19, wherein the reacting is carried out under pressure of about 0.5 mTorr to about 50 mTorr and a temperature of about 10° C. to about 35° C.

21. A line obtained by the method of claim 1.

22. The method of claim 1, wherein the step of reacting a surface layer of the line segment comprises a vapor phase etch.

23. The method of claim 1, wherein the step of removing the reaction product comprises heating to a temperature of about 100° C. to about 200° C.

24. The method of claim 1 further comprising providing a photoresist on the blocking layer and removing it prior to the step of reacting a surface layer of the line segment.

25. The method of claim 24, wherein the blocking layer functions as an ARC layer.

26. A method of fabricating a plurality of lines comprising:
   providing a substrate having a hard mask material with a first thickness on the substrate;
   forming a blocking layer on the hard mask material;
   patterning the blocking layer and the hard mask material to provide a first line segment and a second line segment, the first line segment having a first dimension measured across the first line segment, and the second line segment having a second dimension measured across the second line segment;
   patterning a blocking mask on the first line segment;
   reacting a surface layer of the second line segment to form a layer of a reaction product on a remaining portion of the second line segment not covered by the blocking layer; and
   removing the reaction product without attacking the remaining portion of the second line segment and without attacking the blocking layer and the substrate to form the second line segment with a third dimension across the second line segment that is smaller than the first dimension of the first line segment, and further wherein the thickness of the hard mask material remains equal to the first thickness.

27. The method of claim 26, wherein the blocking layer comprises silicon.

28. The method of claim 26, wherein the blocking layer comprises germanium.

29. The method of claim 28, wherein after the step of removing the reaction product, the blocking layer is removed without attacking the line segment and the substrate.

30. The method of claim 29, wherein the blocking layer is removed by a solution comprising hydrogen peroxide.

31. The method of claim 26, wherein the step of reacting a surface layer of the second line segment comprises a self-limiting reaction.

32. The method of claim 26, wherein in the step of patterning the blocking layer and the hard mask, the first dimension and the second dimension are equal.

33. The method of claim 26, wherein the blocking mask comprises photoresist.

34. The method of claim 26 further comprising providing a photoresist on the blocking layer and removing it prior to the step of patterning a blocking mask on the first line segment.

35. A method of fabricating a line comprising:

providing a substrate having a hard mask material with a first thickness on the substrate;

forming a blocking layer with a second thickness on the hard mask material, wherein the blocking layer comprises an anti-reflective coating;

patterning the blocking layer and the hard mask material to provide a line segment, the line segment having a first dimension measured across the line segment;

reacting a surface layer of the line segment to form a layer of a reaction product on a remaining portion of the line segment not covered by the blocking layer; and removing the reaction product without attacking the remaining portion of the line segment and without attacking the blocking layer and the substrate to form the line segment with a second dimension across the line segment that is smaller than the first dimension, and wherein the thickness of the hard mask material remains equal to the first thickness.

36. The method of claim 35, wherein the first and second thicknesses are selected such that a first light wave reflected from a surface of the blocking layer has an intensity equal to a second light wave which is transmitted through the blocking layer and the hard mask material, reflected from a surface of the substrate, and again transmitted through the hard mask material and the blocking layer, and further wherein the first light wave is 180 degrees out of phase with the second light wave.

37. The method of claim 36, wherein the hard mask comprises oxide with a first thickness from about 400 to about 600 Angstroms and the blocking layer comprises silicon with a second thickness from about 40 to about 45 Angstroms.

38. The method of claim 35, wherein the anti-reflective coating comprises silicon.

* * * * *